(12) United States Patent
Mahawili

(10) Patent No.: US 6,800,830 B2
(45) Date of Patent: Oct. 5, 2004

(54) CHEMISTRY FOR BORON DIFFUSION BARRIER LAYER AND METHOD OF APPLICATION IN SEMICONDUCTOR DEVICE FABRICATION

(75) Inventor: Imad Mahawili, Grand Rapids, MI (US)

(73) Assignee: Hitachi Kokusai Electric, Inc., Tokyo (JP)

( * ) Notice: Subject to any disclaimer, the term of this patent is extended or adjusted under 35 U.S.C. 154(b) by 342 days.

(21) Appl. No.: 09/931,595

(22) Filed: Aug. 16, 2001

(65) Prior Publication Data

US 2002/0023900 A1 Feb. 28, 2002

Related U.S. Application Data

(60) Provisional application No. 60/226,167, filed on Aug. 18, 2000.

(51) Int. Cl.[7] .............................................. B23K 10/00
(52) U.S. Cl. .......................... 219/121.41; 219/121.59; 438/287; 438/584; 438/513
(58) Field of Search ......................... 219/121.4, 121.41, 219/121.43, 121.59; 438/284–287, 591, 513, 579, 584, 593

(56) References Cited

U.S. PATENT DOCUMENTS

| 5,963,810 A | 10/1999 | Gardner et al. ............. 438/287 |
| 6,027,992 A | 2/2000 | Gardner et al. ............. 438/588 |

FOREIGN PATENT DOCUMENTS

| EP | 0844647 A3 | 11/1997 |
| EP | 0844647 A2 | 11/1997 |
| EP | 0847079 A3 | 12/1997 |
| EP | 0847079 A2 | 12/1997 |
| WO | WO9805074 | 2/1998 |

*Primary Examiner*—Mark Paschall
(74) *Attorney, Agent, or Firm*—Van Dyke, Gardner, Linn & Burkhart, LLP

(57) ABSTRACT

A method of fabricating a semiconductor device includes providing a semiconductor substrate, forming an oxide layer in the substrate, and adding nitrogen atoms on top of the exposed surface of the oxide film to form a diffusion barrier.

51 Claims, 6 Drawing Sheets

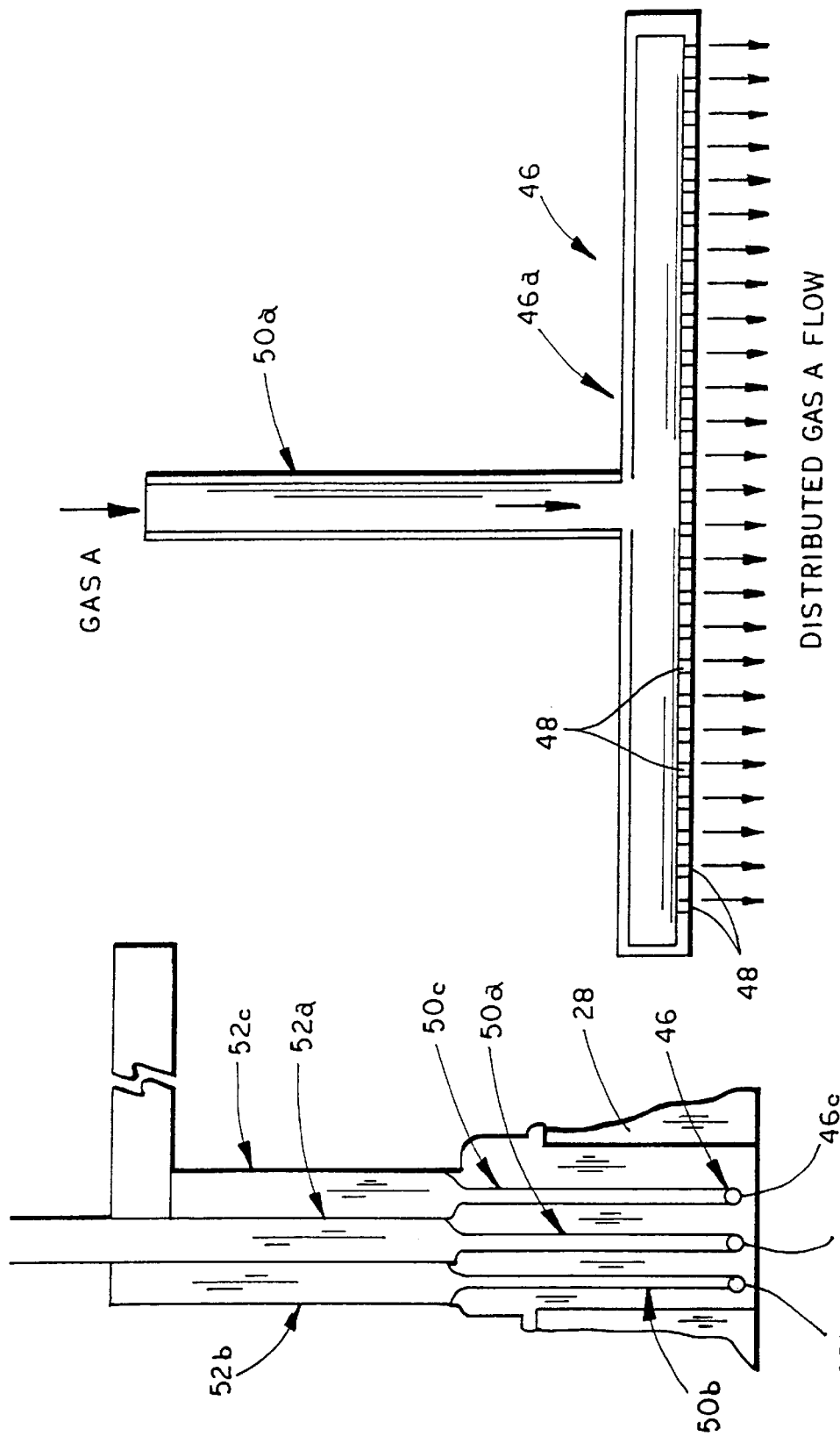

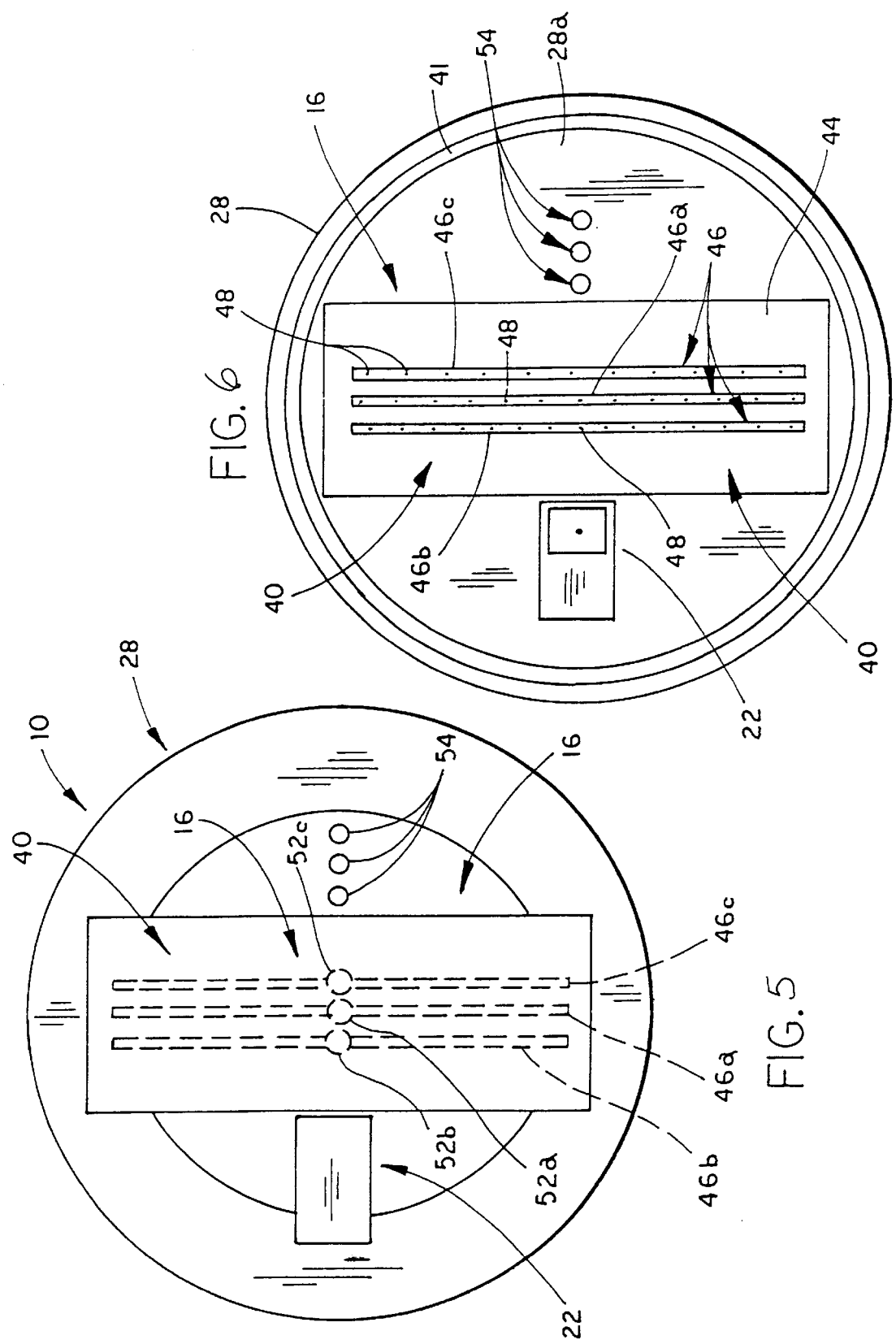

CHEMISTRY FOR BORON DIFFUSION BARRIER LAYER AND METHOD OF APPLICATION IN SEMICONDUCTOR DEVICE FABRICATION

This application claims priority from U.S. Pat. provisional application Ser. No. 60/226,167, filed Aug. 18, 2000, by Imad Mahawili, PhD, entitled NOVEL CHEMISTRY FOR BORON DIFFUSION BARRIER LAYER AND METHOD OF APPLICATION IN SEMICONDUCTOR DEVICE FABRICATION.

TECHNICAL FIELD AND BACKGROUND OF THE INVENTION

In the fabrication of a semiconductor device, such as a solid state transistor, several thin film processes are involved. In brief, and for example, the silicon wafer is first wet cleaned and then a film of silicon oxide is formed by heating the wafer in an oxygen environment at an elevated temperature. After the silicon oxide film is formed, a silicon nitride film is deposited on the oxide film. This deposition of the silicon nitride film is achieved using ammonia and silane in a low pressure chemical vapor deposition system. A field oxide is then deposited after several serial steps of dry etch removal of deposited resist, wet clean, oxidation and final planarization in various equipment sets. The circuit pattern begins to shape up by several lithographic processes of the transistor design that is intended to be used. The N-well and the P-well that form the source and drain of the transistor are then created by separate ion implant, resist ashing, and wet clean steps.

A rigorous wafer wet pre-clean then typically follows using various concentrations of inorganic acids such as hydrofluoric acid. The wafer is then oxidized at elevated temperature ranging from 600° C. to 1050° C. in ambients such as oxygen, oxygen with dichlorosilane and water vapor, or oxygen and hydrogen. This oxide, called the transistor gate oxide, is then typically annealed at high temperature, near 1000° C., in nitrogen ambient with ammonia or nitrous oxide. This last annealing step forms a layer of silicon nitride which usually incorporates a certain amount of nitrogen within the gate oxide. Silicon nitride is a good conductor as well as an excellent diffusion barrier. When a polysilicon layer is added, which typically contains Boron or Phosphorous, the Boron or Phosphorous atoms can migrate into the gate oxide. The silicon nitride layer, however, acts as a barrier for Boron or Phosphorous migration into the gate. However, as gates get thinner on the order of 20 Angstroms, nitrogen atoms present in the oxide layer affect the performance of the gate. Therefore, the nitrogen migration has become an impediment to increasing the speed of many devices. As the device fabrication geometries have gotten smaller, and nearing the 0.13 micron line width, the nitrogen incorporation within the gate oxide as a diffusion barrier have limited further gains in the speed of these devices.

Consequently, there is a need for a method in which the Phosphorous or Boron atoms that are located in the polysilicon layer for migrating into the gate oxide while able to minimize the gate oxide thickness.

SUMMARY OF THE INVENTION

According to the present invention, a method of fabricating a semiconductor device induces incorporating nitrogen atoms at the oxide film-polysilicon layer interface of the device. The present invention provides a process that incorporates nitrogen atoms in such a way that most, if not all, the atoms reside above the oxide film surface and not within it. This offers maximum Boron atom diffusion prevention from the polysilicon layer, which allows the oxide film to function in a most desirable electrical fashion at very low thicknesses approaching 8 to 15 Angstroms, which increases the speed of the device.

In one form of the invention, a semiconductor device is fabricated by forming an oxide film in a semiconductor substrate followed by adding nitrogen atoms on top of the exposed surface of the semiconductor substrate to form a diffusion barrier wherein the nitrogen atoms do not penetrate the oxide film.

In one aspect, the nitrogen atoms are added by exposing the substrate to a plasma containing nitrogen gas. For example, the substrate may be exposed to the plasma in a temperature in a range of 25° C. to 800° C. or in a temperature of about 25° C. In a further aspect, the substrate is exposed to a nitrogen plasma in a pressure in a range of 10 mTorr to 1000 mTorr or, more preferably, in a pressure of about 150 mTorr.

In another aspect, the substrate is also exposed to helium gas. Preferably, the substrate is exposed to a plasma containing nitrogen gas and helium gas.

In yet another aspect, the substrate is exposed to a plasma containing nitrogen gas in the presence of silane gas wherein the nitrogen and silane form a silicon nitride film on top of the oxide film. For example, the substrate may be exposed to a plasma containing nitrogen gas in the presence of silane gas in a pressure in a range of about 50 mTorr to 750 mTorr or in a pressure of about 250 mTorr.

According to another form of the invention, a semiconductor device is fabricated by forming an oxide film in a substrate with the film having an exposed surface and an interface surface with the substrate. The exposed surface is exposed to silane gas to form silane molecules on the exposed surface. Nitrogen atoms are added on top of the exposed surface of the oxide film wherein the nitrogen atoms react with the silane molecules to form a diffusion barrier.

In one aspect, the nitrogen atoms are added by exposing the substrate to a plasma containing nitrogen gas. For example, the substrate may be exposed to the plasma containing nitrogen gas in a temperature in a range of 25° C. to 800° C. or in a temperature of about 25° C.

In yet another form of the invention, a semiconductor device is fabricated in a processing chamber of a processing apparatus by forming an oxide film in a semiconductor substrate. A plasma containing a nitrogen gas is injected into the processing chamber in the presence of silane gas to form a diffusion barrier on top of the oxide film.

In one aspect, the plasma is injected into the processing chamber under a pressure in a range of about 50 mTorr to 750 mTorr or, more preferably, of about 250 mTorr.

In another aspect, silane gas is injected into the processing chamber with a gas flow in a range of about 5 to 50 cm3/min. Preferably, silane gas is injected into the processing chamber with a gas flow of about 25 cm3/min.

According to another aspect, the plasma is generated with a plasma generator with a radio frequency of in a range of about 5 to 50 MHz, and, more preferably, with a radio frequency of about 13.56 MHz. Furthermore, the power input of the plasma generator is in a range about 50 to 1000 Watts, and, more preferably, about 400 Watts.

According to another form of the invention, a semiconductor device is fabricated by adding nitrogen atoms on to the surface of a semiconductor substrate. Thereafter, an oxide film is formed in the substrate over the nitrogen atoms, wherein the nitrogen atoms are incorporated into the oxide film to form a diffusion barrier.

In another form of the invention, a semiconductor device includes a semiconductor substrate, an oxide film formed in the substrate, and a diffusion barrier formed on top of the exposed surface of the oxide film wherein the molecules forming the diffusion barrier do not penetrate the oxide film.

In one aspect, the diffusion barrier includes nitrogen atoms.

In other aspects, the oxide film has a thickness in a range of 10 to 50 Angstroms.

According to another aspect, the oxide layer forms a gate oxide film of a transistor.

In yet other aspects, the diffusion barrier includes nitrogen and silane atoms. Furthermore, the diffusion barrier has a thickness in a range of 5 to 30 Angstroms, and, more preferably, in a range of 15 to 20 Angstroms.

According to yet another form of the invention, a semiconductor device includes a semiconductor substrate, a film formed in the substrate, which comprises a high dielectric material, and a diffusion barrier formed on top of the exposed surface of the film wherein the molecules forming the diffusion barrier do not penetrate the film.

For example, the semiconductor substrate preferably comprises a silicon wafer, with the film comprising at least one material from a group including zirconium oxide and hafnium oxide.

In addition, the diffusion barrier includes nitrogen atoms, and may include both nitrogen and silane atoms.

In further aspects, the diffusion barrier has a thickness in a range of 5 to 30 Angstroms, and, more preferably, in a range of 15 to 20 Angstroms.

These and other objects, advantages, purposes, and features of the invention will become more apparent from the study of the following description taken in conjunction with the drawings.

BRIEF DESCRIPTION OF THE DRAWINGS

FIG. 3 is an enlarged cross-section of the section designated III—III of FIG. 2;

FIG. 4 is an enlarged view of a gas injector tube of the apparatus of FIGS. 1 and 2;

FIG. 5 is an enlarged top plan view of a cover of the apparatus of FIG. 1;

FIG. 6 is a bottom plan view of the cover of FIG. 5;

DESCRIPTION OF THE PREFERRED EMBODIMENTS

Figure 1:
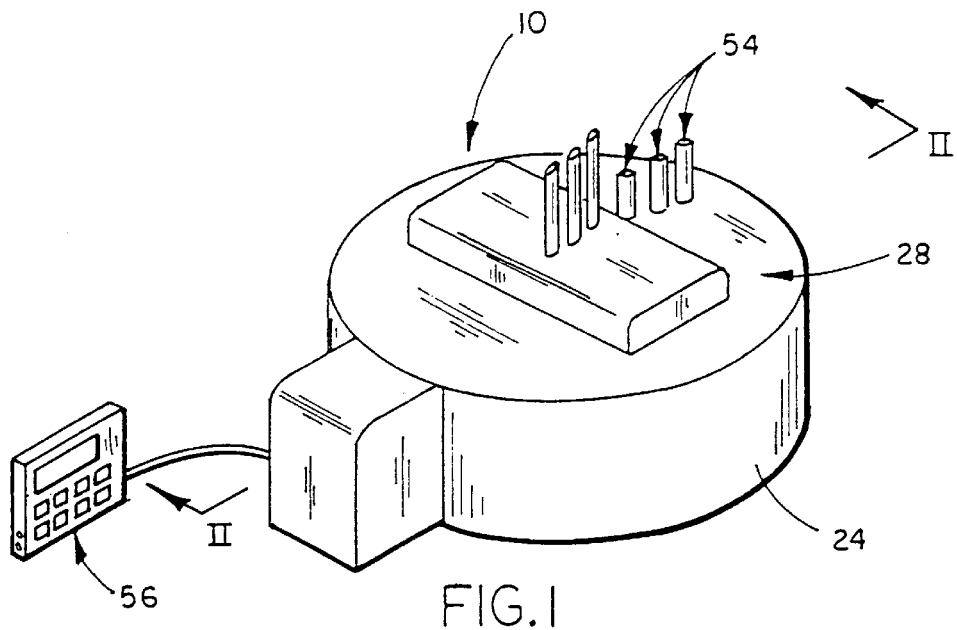
FIG. 1 is a perspective view of a processing apparatus.

Referring to FIG. 1, the numeral 10 generally refers to a processing apparatus for processing semiconductor substrates. Apparatus 10 is suitable for performing various fabrication and treatment processes on a semiconductor substrate 12, such as a semiconductor wafer, including thermal processing, for example thermal annealing, thermal re-flow of boro-phosphorous gases, and further chemical vapor deposition of thin film applications, such as oxide films, nitride films, doped and undoped polysilicon films, silicon epitaxial and tungsten metal and tungsten silicide films and the like, in the fabrication of semiconductor devices. As will be described in more detail below, apparatus 10 is used to fabricate semiconductor devices in which nitrogen atoms are added to form a Boron or phosphorous atom diffusion barrier in a manner to limit, if not eliminate, the diffusion of the nitrogen atoms into the device itself to thereby increase the device speed.

Figure 2:
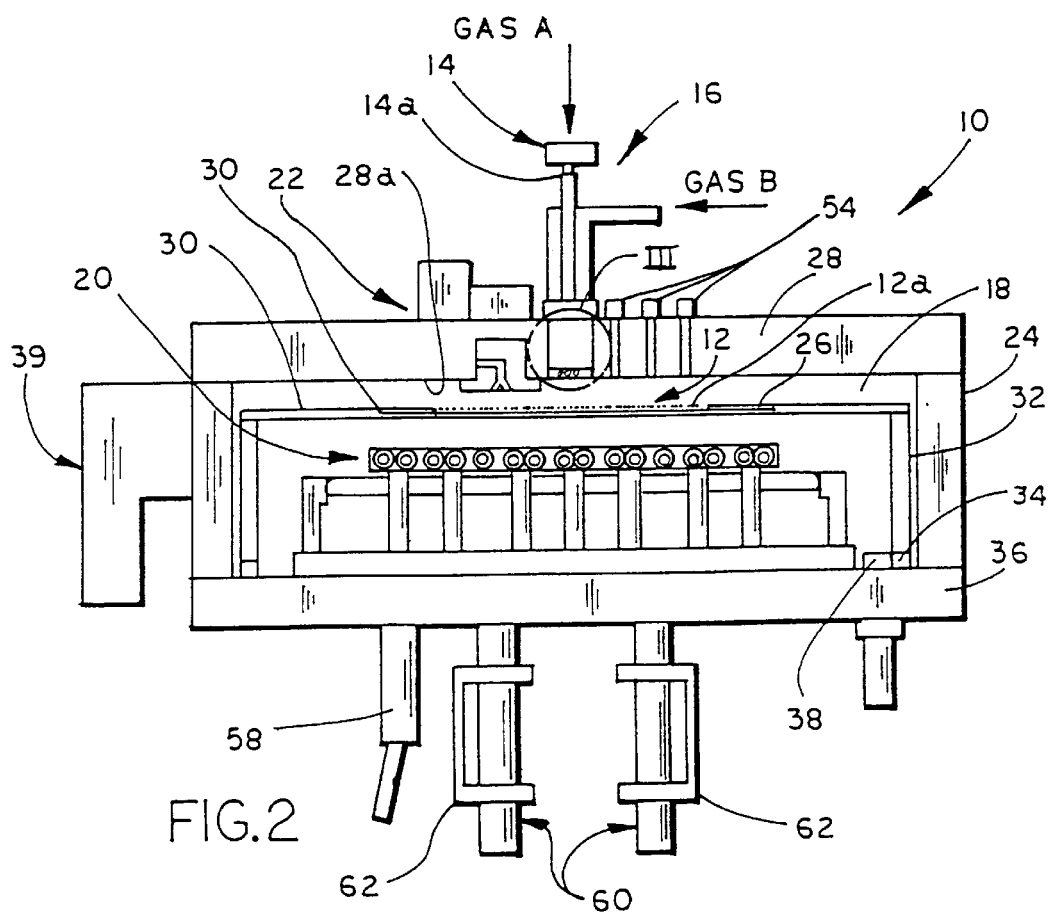
FIG. 2 is a cross-section view taken along line II—II of FIG. 1

Referring to FIG. 2, apparatus 10 includes a gas injection system 16, which injects one or more gases into a processing chamber 18 for processing a substrate 12. Gas injection system 16 includes a plasma generator 14 for raising the level of energy of the gases preferably prior to injection into the processing chamber. Plasma generator 14 preferably ionizes the gases for injection into the processing chamber (18) and, more preferably, ionizes the gases into a plasma, which relaxes the electron temperature. In addition, by ionizing the gases into a plasma, the heating associated with most chemical vapor deposition processing, may be reduced or eliminated in some cases. In addition, by ionizing the gases, stability of already deposited films is enhanced. Furthermore, since the generator 14 is located outside processing chamber 18, the generator ionizes the gas or gases before injection into the processing chamber thus isolating the substrate, typically a semiconductor substrate, from the high electron energy of the plasma field which prevents changes to the substrate, such as device damage and/or failure that typically occurs when the substrate is exposed to such high electron energy.

Again referring to FIG. 2, apparatus 10 includes a heater assembly 20, which delivers heat to the substrate, preferably in a uniform manner, and an emissivity measurement assembly 22. For further details of suitable heaters, reference is made to U.S. Pat. No. 5,951,896, which is commonly assigned to Micro C Technologies, Inc. of Grand Rapids, Mich. For further details of a suitable emissivity measurement assembly, reference is made to U.S. Pat. No. 5,814, 365, also commonly assigned to Micro C Technologies, Inc. of Grand Rapids, Mich.

Apparatus 10 includes a housing 24 which forms processing chamber 18. Substrate 12 is supported in processing chamber 18 on a platform 26, which is made from a suitable material, such as silicon carbide coated graphite, quartz, pure silicon carbide, alumina, zirconia, aluminum, steel, or the like. Substrate 12 is supported such that its device side 12a is directed upwards to an upper wall or cover 28 of housing 24. For examples of suitable platforms, reference is made to pending U.S. Pat. Nos. 6,090,212 and 6,007,635 both commonly assigned to Micro C Technologies of Grand Rapids, Mich., which are incorporated by reference herein.

Platform 26 is preferably seated and supported in a recessed central opening 30a provided in a top wall 30 of a second, rotatable housing 32. Housing 32 is preferably rotatably supported in housing 24 on a base 34. Base 34 and second housing 32 are rotatably supported on base wall 36 of housing 24 and are preferably rotated using a conventional magnetically coupled drive mechanism 38 or another suitable driving device, which can apart rotation to base 34 through a vacuum seal. In this manner, substrate 12 is rotatably supported in housing 24. Furthermore, by rotating substrate 12, apparatus 10 may provide a uniform application of heat and gases over the substrate's entire surface. For example, the revolutions per minute (rpm) of base 34 and housing 32 may be preset, for example, in a range of 5 to 60 rpm depending on the specific process.

Heater assembly 20 is enclosed by housing 32 and platform 26, which rests on top of housing 32 to complete the enclosure of heater assembly 20 in housing 32. Platform 26 supports substrate 12 spaced from lower surface 28a of cover 28, with the space therebetween defining processing chamber 18. Processing chamber 18 is preferably evacuated through a vacuum exhaust port. The vacuum exhaust port may be provided in gas injector assembly 16, described more fully below. The substrate (12) is placed in chamber 18 through a chamber valve 39 and is placed on platform 26 by a conventional wafer transport device, such as an automatic transport robot.

Referring to FIGS. 5 and 6, gas injection assembly 16 includes manifold 40 through which one or more gases are injected into processing chamber 18 on substrate 12. Manifold 40 is formed from a plurality of gas injector tubes 46 which are arranged in a spaced relationship to extend over substrate 12 and are supported in cover 28. Preferably, tubes 46 comprise non-reactive gas tubes, for example quartz or alumina tubes or the like. Each gas injection tube 46 is isolated from the adjacent gas injection tube and is aligned so that manifold 40 injects the gas or gases onto localized or discrete regions of substrate 12 where the thin film deposition process takes place. In addition, each tube 46 is preferably removably supported in cover 28 so that one or more tubes 46 may be removed for cleaning or replacement.

Manifold 40 also includes a gas injection ring 41, which extends around tubes 46 and around exhaust manifold 44, which similarly extends around tubes 46 radially inward of inner gas injection ring 41. Injection ring 41 is typically used to inject an inert gas, such as nitrogen or the like, into processing chamber 18 and directs the inert gas to the perimeter of the substrate to form a gas barrier so that when reactive gases are injected through gas injection tubes 46 the reactive gases are confined to an area of the substrate directly below the respective tubes 46 due to the placement of the vacuum exhaust manifold 44 being adjacent the gas injection tubes 46. Exhaust manifold 44 extends along and is adjacent gas injection tubes 46 so that any stray gas molecules which migrate near the region under exhaust manifold 44 will be exhausted from processing chamber 18. Therefore, the gas or gases introduced by gas injection tubes 46 are confined to a discrete volume of processing chamber 18 and, further, to a discrete area of substrate 12.

Referring to FIGS. 3 and 4, each tube 46 includes a plurality of orifices or holes 48, which may be formed, for example, by drilling, including laser drilling. Holes 48 are for directing or dispersing the gas in the tube onto the substrate 12. The size, location, and pitch of each orifice or hole may be varied as described to vary the flow of the gas and, further, may be varied along the length of tube 46 to adjust the profile of the injected gas to optimize gas distribution over substrate 12. Referring again to FIG. 3, manifold 40 preferably includes three tubes, a central tube 46a and two outer tubes 46b, 46c. Optionally, each tube 46a, 46b, or 46c may be associated with and inject a respective gas onto substrate 12. For example, central tube 46a may be used to inject a first gas, while tubes 46b and 46c may be used to inject a second gas. In addition, the flow through each tube 46 may be individually controlled so that they can all turn on together or be sequenced one tube after another, or in a random sequence with various time intervals between each on/off cycle. Furthermore, as gases are turned off from one tube, another gas may be injected into the tube to control the reaction conditions at the surface of the wafer and to prevent any back flow contamination of the gases. Furthermore, each of the respective tubes 46a, 46b, 46c may be associated with an injection of a specific gas. A wide variety of gases can be employed and selectively introduced through the orifices 48, for example hydrogen, argon, tungsten, hexaflouride, nitrogen, helium, or the like to process substrate 12.

Referring to FIG. 4, each tube 46a, 46b, 46c includes or is in communication with a delivery tube 50a, 50b, 50c, respectively, which extends from tubes 46a, 46b, 46c through cover 28. Each delivery tube 50a, 50b, or 50c is preferably coupled in series to a larger diameter supply tube 52a, 52b, or 52c, respectively, which is positioned outside chamber 18 and above cover 28. For example, tubes 50a, 50b, 50c, 46a, 46b, 46c, may each have a diameter of approximately 0.25 inches with tubes 46a, 46b, and 46c having orifice hole diameters of about 0.20 inches. Supply tubes 52a, 52b, and 52c each have a diameter in a range of 0.5 inch to 1 inch or larger. When a gas is fed through this center gas injector tube at reduced chamber pressures, for example below 1 Torr and typically in a range of 0.1 to 0.3 Torr, and simultaneously the plasma generator is energized, the gas undergoes dissociation and ionization within the larger confines of the larger quartz tube. Supply tubes 52a, 52b, and 52c are also preferably formed from non-reactive material, such as quartz or alumina, and deliver ionized gases to tubes 46a, 46b, 46c by way of tubes 50a, 50b, 50c and, preferably, deliver gas ionized into a plasma, as will be more fully described below.

As best seen in FIG. 6, gas injection manifold 40 includes an exhaust manifold 44. As described above, exhaust manifold 44 extends around tubes 46a, 46b, 46c to provide an additional boundary beyond which the gases injected by tubes 46a, 46b, or 46c can not extend. In addition to removing unreacted gases from the processing chamber 18, exhaust manifold 44 also assists in the prevention of back flow contamination of the gases. In combination with injection ring 41, exhaust manifold 44 controls the film deposition on substrate 12 in a manner which results in localized area film deposition and, further, permits use of the emissivity measurement system described below.

The gas or gases injected into chamber 18 may be ionized before injection into processing chamber 18 so that the energy level in the gas is raised prior to injection into chamber 18. As noted above, the plasma generator 14 is mounted exteriorly of the reactor to isolate the high electron energy from the plasma field from reaching the substrate being processed in chamber 18. By isolating the plasma field, this system prevents changes in the substrate from occurring due to high electron energy which can cause device decay and failure. Plasma generator 14 produces an electromagnetic field through which the reactant gases flow before entering supply tubes 52a, 52b, or 52c. Optionally, one or all the gases may be ionized before injection into chamber 18. Generator 14 includes a tuned cavity, such as a microwave cavity, that surrounds a tube 14a which is inserted into the respective supply tube 52a, 52b, or 52c. Plasma generation is affected by using a microwave generator with a suitable electrical matching network. This high frequency alternating power is supplied to the tuned cavity that surrounds tube 14a, which is preferably made of quartz or aluminum material, and in which the gas to be excited is flowing. At certain power, the flowing gas atoms become excited and even ionized depending on the power input. Excited and ionized gas atoms are then directed rapidly onto the wafer using the quartz or aluminum tubing distributor. As will be more fully described below, once the excited gas species enters the chamber, the species react either with another gas in the chamber and/or with the silicon wafer surface itself. After the gas passes through plasma generator 14 and enters supply tubes 52a, 52b, and 52c, which preferably provide an enlarged passage, the respective gas ionizes and dissociates and, most preferably, ionizes into a gas plasma. As a result, the gas being injected into chamber 18 is more reactive with the semiconductor substrate, for example silicon, germanium, or gallium arcinide and, further, the process temperatures required to achieve film deposition, for example, is reduced.

As noted above, reactor 10 preferably includes a non-contact emissivity measurement system 22 for measuring the emissivity and calculating the temperature of substrate 12 to one of the various fabrication processes. Emissivity measurement system 22 determines the temperature of substrate 12 by comparing the radiation emitted by a reference light source, which is preferably positioned in the chamber 18, with that of the radiation emitted by substrate 12. The reference light source preferably includes at least one lamp which is similar to construction to the lamps used in heater assembly 20, which are described in U.S. Pat. No. 5,951, 896.

Reactor 10 further includes a plurality of optical fiber temperature measurement probes 54 which are fixed to cover 28 and constantly collect photon density data emitted from the device side 12a of substrate device 12 during all processing conditions. The temperatures measured by probes 54 are sent to a main computer control to compare them to a set temperature and any deviation is computed and transformed into a control current to drive a standard off-the-shelf SCR current relay to deliver the proportional power to each of the lamp zones then the heater assembly 20. Preferably, reactor 10 includes three probes 54 which are positioned to measure the temperature of different parts of the wafer which assures temperature uniformity during the processing cycle.

Temperature readings of substrate 12 calculated by processing unit 56 are preferably used as input into a control system (not shown) which monitors and controls the output of heater assembly 20. The control system is coupled to heater assembly 20 through an electrical feed through 58 which extends through the base wall 36 of reactor housing 24. In order to maintain the vacuum in reactor 10, feed through 58 is sealed by an O-ring or sealed using other conventional sealing devices or methods. Reference is made to U.S. Pat. No. 5,814,365 for further details of a suitable emissivity measurement system.

After semiconductor substrate 12 has been processed, substrate 12 is lifted off platform 26 by a plurality of lifter pins 60 which protrude through platform 26 and lift substrate 12 off platform 26 for automatic loading and unloading of substrate 12 within apparatus 10. Lifter pins 60 are raised and lowered by magnetically coupled wafer lifters 62 which are conventionally known in the art. Pins 56 are centrally located in housing 24 and project through a central portion of the heater assembly 20 and through a central portion of platform 26. Similarly, to maintain the vacuum in chamber 18 lifter pins 54 extend through O-ring seals provided in the base wall 36 of housing 24.

Plasma generator 14 preferably comprises an electromagnetic field plasma generator 114 (FIG. 7) and includes a generator tube 116, a sleeve 118, which extends around generator tube 116, and a coil 120 which extends around sleeve 118. Sleeve 118 preferably comprises a water-cooled sleeve to provide cooling for coil 120. Coil 120 is grounded on one end and electrically coupled to a drive circuit 121. Drive circuit 121 includes a power source 122, such as a radio frequency (RF) power source or a microwave power source, and an impedance matching network 124. For example, where power source 122 comprises an RF power source, power source 122 may have a frequency of 13.56 MHz, and supply power preferably in a range of about 800–1200 watts and, more preferably, about 1000 watts. Coil 120 is preferably a copper coil with a diameter, for example, of about 0.15 inch and is wound around sleeve 120 between about 2 and 20 turns and, more preferably, about 7 turns.

Figure 7:
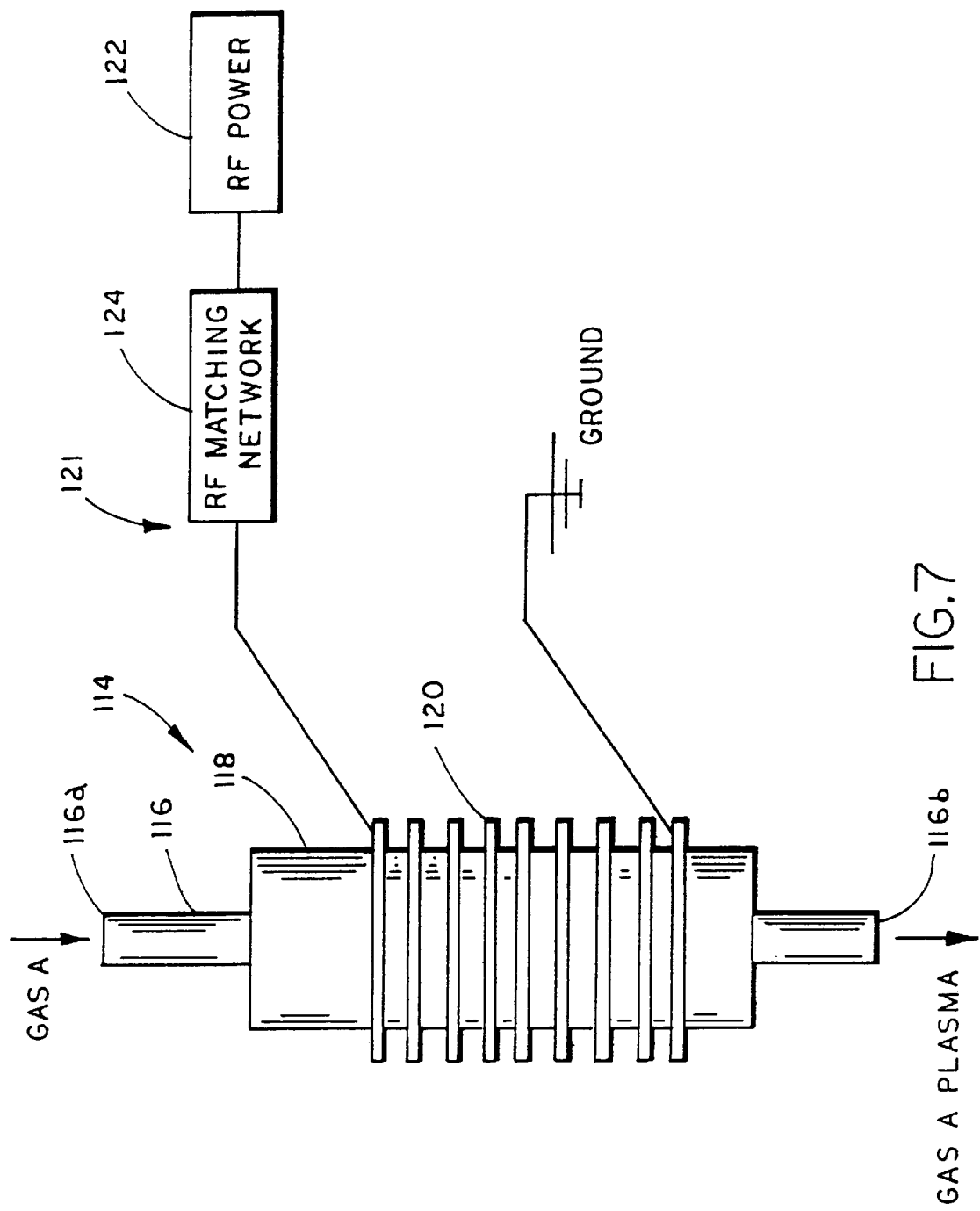
FIG. 7 is an enlarged view of a remote plasma generator of the apparatus of FIGS. 1–6.

As best seen in FIG. 7, generator tube 116 includes an input end 116a and an output end 116b, with output end 116b being inserted into a respective supply tube 52a, 52b, or 52c. When gas is injected into input end 116a of generator tube 116, power supply 122 is energized and coil 120 generates an electromagnetic field within generator tube 116. At a given power, the gas undergoes dissociation and ionization with the confines of the larger supply tube 52a, 52b, or 52c. These "excited" gas species are then fed into chamber 18 and impinge onto substrate 12. Depending on the chemical nature of the gas fed into chamber 18 via center tube 46a and outer tubes 46b and 46c, numerous processes can be achieved as described in the examples above.

As previously noted, apparatus 10 is used to process substrate 12 to fabricate a semiconductor device, such as a transistor, in which nitrogen atoms are added to form a diffusion barrier, such as a Boron or Phosphorous diffusion barrier, in a manner to limit, if not eliminate, the diffusion of the nitrogen atoms into the device itself to permit the thickness of the oxide layer forming the device to be reduced to thereby increase the device speed.

The silicon wafer comprising the substrate is initially wet pre-cleaned using various concentrations of inorganic acids, such as hydrofluoric acid. The silicon wafer is placed in the processing chamber (18) in which an oxide film for forming, for example a gate, is grown by thermally oxidizing the wafer at temperatures in a range of 600° C. to 1100° C. in an ambient of oxygen, oxygen with hydrogen, or oxygen with water vapor. Subsequently, nitrogen gas is fed into processing chamber 18 using gas injection assembly 16 while the substrate is rotated, for example at speeds in a range of about 5 to 60 rpm. The nitrogen gas is preferably fed into chamber 18 through the plasma generator 14 so as to excite the nitrogen gas. The pressure of the plasma nitridation is typically in a range of 10 mTorr to 1000 mTorr but preferably approximately 150 mTorr. In addition, the temperature range in processing chamber 18 is between 25° C. to approximately 800° C., but most preferably at room temperature. Therefore, heater assembly 20 may or may not be needed for this segment or portion of the process.

In addition to the nitrogen, helium gas is injected into processing chamber 18 along with the nitrogen gas through gas injection assembly 16. Preferably, the helium gas and the nitrogen gas are injected into processing chamber 18 through plasma generator 14 to thereby form a plasma containing both nitrogen gas and helium gas. As noted previously, injector tubes 46a, 46b, and 46c include multiple holes for good distribution of the gas plasma over the substrate 12. The addition of helium gas to the nitrogen gas increases the amount of nitrogen added due to the more sustained excitation of helium and, therefore, longer excitation time induced into the nitrogen ion matrix through third body collisions. A secondary ion microscopy (SIMS) shows that the nitrogen atoms are added on to the top surface of the gate oxide only and not distributed throughout the oxide layer. Therefore, oxide layers with thicknesses in a range of 10 to 50 Angstroms can be formed that exhibit increased stability and produce increased speed for the device. Preferably, the thicknesses of the oxide film may be reduced below 20 Angstroms, on the order of about 10 Angstroms.

Alternately, nitrogen gas is injected into processing chamber 18, in accordance with the method described above, before the silicon wafer is oxidized. In this manner, nitrogen atoms are added to the surface of the substrate. After the nitrogen has been added, the silicon wafer is then oxidized at a high temperature in an oxygen environment, such as described above. As a result, nitrogen is incorporated in the oxide film under a profile that is high at the surface and decreases as one samples through the oxide thickness. As a result, the oxide film thickness can be reduced to a range of 10 to 50 Angstroms, and, more preferably, below 20 Angstroms. A secondary ion microscopy (SIMS) illustrates that the concentration of nitrogen is high at the surface of the oxide and then decreases through the thickness of the oxide. This approach achieves a tailored nitrogen profile that peaks at the gate oxide film.

It has been found that the nitridation of bare silicon surface, i.e. un-oxidized, described above is a much faster process than nitridation of an oxidized silicon, i.e. a gate oxide. For example, the silicon surface is exposed to the gas plasma for a time period in a range of 5 to 60 seconds and, more preferably, for about 30 seconds.

In yet another approach, nitrogen and helium are injected into the plasma tube of the gas injection assembly 16 and injected into the processing chamber 18 on the wafer, after formation of the gate oxide, through injector tube 46b as a gas plasma, as described above. In addition, silane gas is fed into processing chamber 18. The excited nitrogen atoms react with the adsorbed silane molecules on the wafer surface. This then creates a facile reaction site for more nitrogen incorporation and a new film of N—$(Si)_3$ grows on top of the gate oxide. This process is preferably performed at room temperature and near approximately 1000 mTorr.

Figure 9:
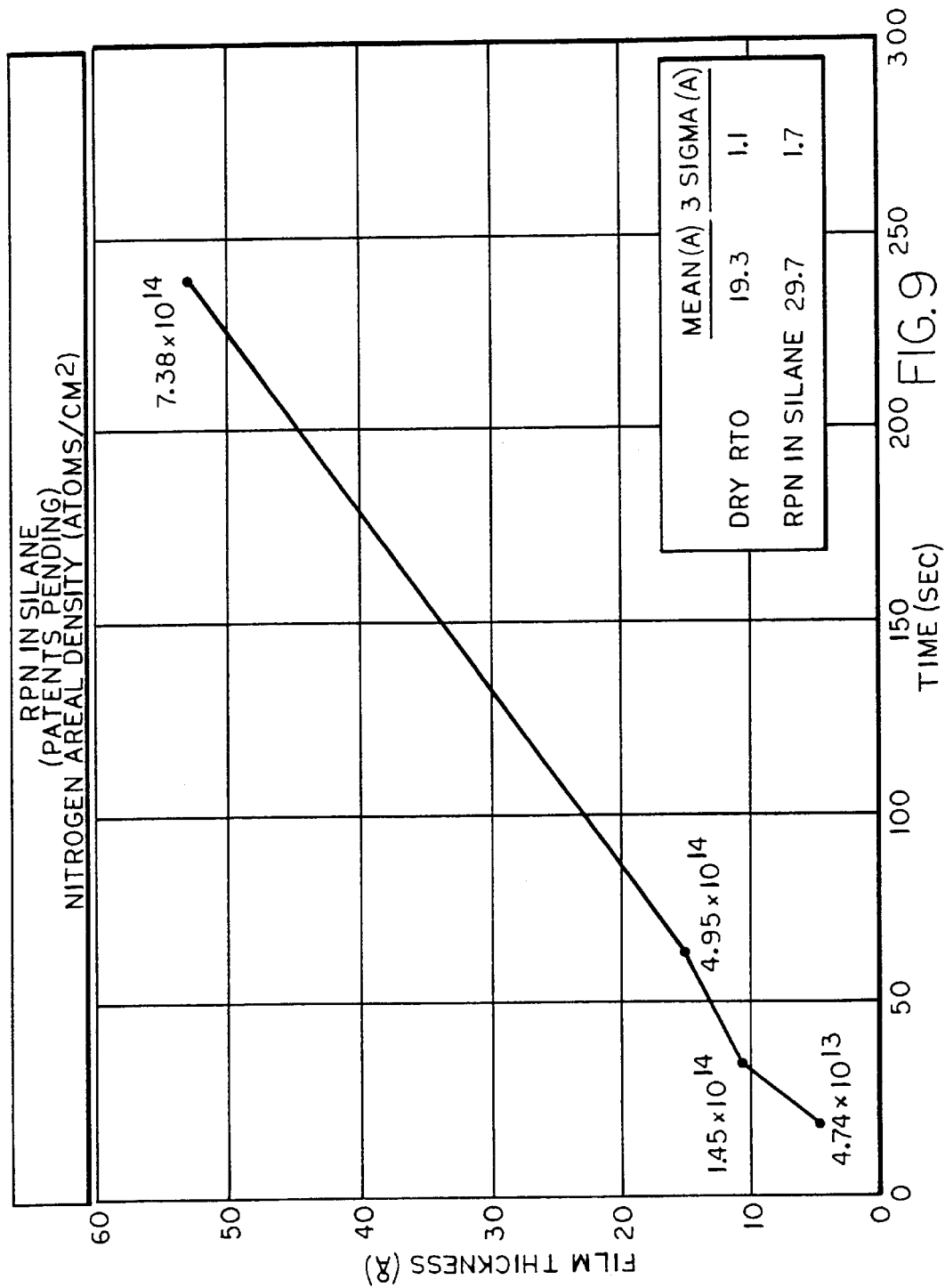
FIG. 9 is a graph illustrating the thickness of the diffusion barrier film as a function of time.

Referring to FIG. 9, the illustrated graphs show that the added film thickness has a high correlation with the process time. Furthermore, the graphs illustrate that as the film gets thicker more nitrogen is incorporated on top of the gate oxide. This new film, with its matrix of nitrogen and silicon, offers a good bridging material between the gate oxide and the polysilicon film that is subsequently deposited with a thickness of approximately in a range of 800 to 1500 Angstroms, and more preferably about 1200 Angstroms. Therefore, it should not affect the electrical performance of the gate oxide. A detailed X-Ray Photoelectron Spectroscopy (XPS) analysis was performed on this material and it identified the silicon-to-nitrogen bonding energy of 398.0 eV was consistent with that of N—$(Si)_3$. This is a very novel approach resulting in this novel film constitution as a method of adding this film on a gate oxide with selectable nitrogen concentration and without additional oxide dielectric thickness that would be encountered if a silicon nitride or silicon oxynitride was added to the film.

This achieves high concentration of nitrogen atoms on the surface of the gate oxide. Atomic nitrogen up to 10%, or even higher, can be added onto the surface of the gate oxide. However, while this nitrogen addition is feasible within the present processing apparatus and heating system, it has been demonstrated that when the ambient is silane gas within the chamber, a highly nitrogen enriched silicon atomic matrix (N—$(Si)_3$) grows on top of the gate oxide. This film can be added and controlled to be of such a thickness as to give the desired nitrogen concentration as shown in FIG. 9.

Typical process conditions consist of injecting silane gas into processing chamber 18, after the formation of the gate oxide, with a flow in a range of 5 to 500 cm3/min and, more preferably, of about 25 cm3/min silane and at a chamber pressure in a range of 50 to 750 mTorr, and more preferably, about 250 mTorr. The processing temperature in chamber 18 is typically room temperature but higher temperatures can be used, for example temperatures in a range of 100° C. to 700° C. The radio frequency of plasma generator 14 is in a range of about 5 to 50 MHz and, more preferably, about 13.56 MHz and is driven by a power source in the range of 50 to 1000 watts, and, more preferably, of about 400 watts. The processing time and pressure determines the final grown film thickness. For thin gate oxide and good boron penetration barrier, the N—$(Si)_3$ film thickness is in a range of about 5 to 30 Angstroms, with 15 to 20 Angstroms being preferred.

Figure 8:
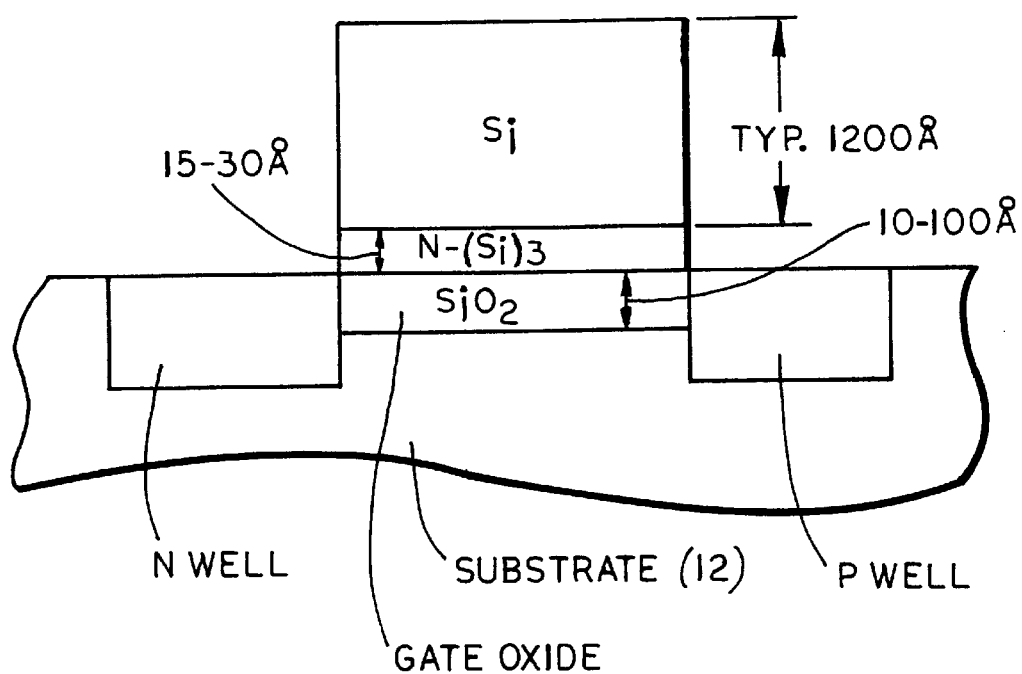
FIG. 8 is an enlarged schematic view of a cross-section of a device formed using the method of the present invention.

Referring to FIG. 8, in fabricating the semiconductor device, once the gate oxide is formed a polysilicon film having a thickness in a range of 800 to 1500 Angstroms, more preferably 1200 Angstrom, is deposited on top of the gate oxide and diffusion barrier. The diffusion barrier's described here are deposited prior to this polysilicon film typically using the first 15 to 25 Angstroms between the gate oxide and the polysilicon film. However, the diffusion barrier thickness, as noted above, is preferably in a range of 5 to 30 Angstroms and, more preferably, 15 to 20 Angstroms.

This N—$(Si)_3$ film can also be added on top of films formed from other materials, such as the new emerging high dielectric constant materials, such as zirconium and hafnium oxides, and also act as a barrier layer for Boron penetration into these films. It is now becoming increasingly understood that the presence of Boron in such materials can significantly reduce their stability and electrical performance.

For the purposes of the following description, the terms "top" or "bottom" and derivatives or equivalents thereof shall relate to the invention as oriented in FIGS. 1–9. In addition, the terms "on" and "on top of" are used interchangeably to mean that something is on top of another thing. Whereas the term "at" is used to mean that it is part of a thing or "in" the thing. It is understood that the invention may assume various alternative orientations and configurations, except where expressly specified to the contrary. It is also understood that the specific dimensions, configurations, devices and methods illustrated in the attached drawings, and described in the preceding specification, are simply exemplary embodiments of the inventive concepts defined in the appended claims. Hence, specific dimensions and other physical characteristics relating to the embodiments disclosed herein are not to be considered limiting unless the claims expressly state otherwise.

While several forms of the invention have been shown and described, other forms will now be apparent to those skilled in the art. For example, other processing apparatuses may be used. Furthermore, the remote plasma system of the present invention may be used in other processing apparatuses. Therefore, it will be understood that the embodiments shown in the drawings and described above are merely for illustrative purposes only, and are not intended to limit the scope of the invention which is defined by the claims which follow.

I claim:

1. A method of fabricating a semiconductor device, said method comprising:

providing a semiconductor substrate;

forming an oxide film on the substrate, the film having an exposed surface and an interface surface at the substrate; and exposing the substrate to a plasma containing nitrogen gas and helium gas, said exposing comprising exposing the substrate to the gas plasma in the presence of silane gas in a pressure in a range of about 10 mTorr to 1000 mTorr wherein the nitrogen atoms form a diffusion barrier on the oxide film and wherein the nitrogen atoms do not penetrate said oxide film.

2. The method according to claim 1, wherein said exposing comprises exposing the substrate to the gas plasma in the presence of silane gas in a pressure in a range of about 50 mTorr to 750 mTorr.

3. The method according to claim 2, wherein said exposing comprises exposing the substrate to a gas plasma containing nitrogen gas in the presence of silane gas in a pressure of about 250 mTorr.

4. The method according to claim 1, wherein said exposing comprises exposing the substrate to the plasma in a temperature in a range of 25° C. to 800° C.

5. The method according to claim 1, wherein said exposing comprises exposing the substrate to the plasma in a temperature of about 25° C.

6. The method according to claim 1, wherein said exposing comprises exposing the substrate to the plasma in a pressure of about 150 mTorr.

7. The method according to claim 1, wherein providing said semiconductor substrate comprises providing a silicon wafer.

8. A semiconductor device formed by the method of claim 1.

9. A semiconductor device formed by the method of claim 4.

10. A semiconductor device formed by the method of claim 1.

11. A method of fabricating a semiconductor device, said method comprising:
providing a semiconductor substrate;
forming an oxide film in the substrate, the film having an exposed surface and an interface surface at the substrate;
exposing the exposed surface to silane gas to form silane molecules on top of the exposed surface; and
exposing the substrate to a plasma containing nitrogen gas at approximately room temperature wherein the nitrogen atoms react with the silane molecules to form a diffusion barrier.

12. The method according to claim 11, wherein said adding comprises exposing the substrate to a plasma containing nitrogen gas.

13. The method according to claim 11, wherein said adding comprises exposing the substrate to a plasma containing nitrogen gas in a temperature of about 25° C.

14. The method according to claim 11, wherein said exposing comprises exposing the substrate to a plasma containing nitrogen gas and helium gas.

15. The method according to claim 11, wherein said adding comprises exposing the substrate to a plasma containing nitrogen gas in a pressure in a range of 10 mTorr to 1000 mTorr.

16. The method according to claim 15, wherein said adding comprises exposing the substrate to a plasma containing nitrogen gas in a pressure of about 150 mTorr.

17. The method according to claim 11, wherein providing said semiconductor substrate comprises providing a silicon wafer.

18. A method of fabricating a semiconductor device, said method comprising:
providing a processing apparatus having a processing chamber;
providing a semiconductor substrate in the processing chamber;
forming an oxide film in the substrate, the oxide film having an exposed surface and an interface surface with the substrate;
injecting a plasma containing nitrogen gas into the processing chamber in the presence of silane gas to form a diffusion barrier on top of the oxide film, whereby the nitrogen atoms do not penetrate the oxide film; and
wherein said injecting comprises injecting the plasma into the processing chamber at approximately room temperature.

19. The method according to claim 18, wherein said injecting comprises injecting a plasma containing a nitrogen gas into the processing chamber under a pressure in a range of 50 mTorr to 750 mTorr.

20. The method according to claim 19, wherein said injecting comprises injecting a plasma containing a nitrogen gas into the processing chamber under a pressure of about 250 mTorr.

21. The method according to claim 18, further comprising injecting silane gas into the processing chamber with a gas flow in a range of about 5 to 50 cm3/min.

22. The method according to claim 21, further comprising injecting silane gas into the processing chamber with a gas flow of about 25 cm3/min.

23. The method according to claim 18, wherein said injecting comprises injecting the plasma at a temperature of about 25° C.

24. The method according to claim 18, further comprising generating the plasma with a plasma generator having a radio frequency of in a range of about 5 to 50 MHz.

25. The method according to claim 24, further comprising generating the plasma with a plasma generator having a radio frequency of about 13.56 MHz.

26. The method according to claim 18, further comprising generating the plasma with a plasma generator having a power input in a range about 50 to 1000 Watts.

27. The method according to claim 26, further comprising generating the plasma with a plasma generator having a power input of about 400 Watts.

28. A semiconductor device formed by the method of claim 18.

29. A method of fabricating a semiconductor device, said method comprising:
providing a semiconductor substrate having a surface;
exposing the surface of the substrate to a plasma containing nitrogen gas wherein nitrogen atoms are added on top of the surface of the substrate; and
forming an oxide film in the substrate over the nitrogen atoms, wherein the nitrogen atoms are incorporated into the oxide film to form a diffusion barrier.

30. The method according to claim 29, wherein said forming includes oxidizing the substrate in a temperature range from about 600° C. to 1100° C.

31. The method according to claim 29, wherein said exposing comprises exposing the substrate for a period of time in a range of 5 to 60 seconds.

32. The method according to claim 31, wherein said exposing includes exposing the substrate for about 30 seconds.

33. The method according to claim 29, wherein said exposing includes exposing the substrate to a plasma containing nitrogen gas and helium gas.

34. The method according to claim 29, wherein said exposing comprises exposing the substrate to the plasma in a pressure in a range of 10 mTorr to 1000 mTorr.

35. The method according to claim 30, wherein said exposing comprises exposing the substrate to the plasma in a pressure of about 150 mTorr.

36. The method according to claim 29, wherein providing said semiconductor substrate comprises providing a silicon wafer.

37. A semiconductor device formed by the method of claim 29.

38. A method of fabricating a semiconductor device, said method comprising:
providing a processing apparatus having a processing chamber;
providing a semiconductor substrate in the processing chamber;
forming an oxide film in the substrate, the oxide film having an exposed surface and an interface surface;
injecting a plasma containing a nitrogen gas into the processing chamber, said injecting including injecting the plasma in the presence of silane gas wherein nitrogen atoms are added to the exposed surface to form a diffusion barrier on the exposed surface of the oxide film; and
wherein said injecting comprising injecting the plasma into the processing chamber in a temperature of about 25° C.

39. The method according to claim 38, wherein said injecting comprises injecting a plasma containing a nitrogen gas into the processing chamber under a pressure in a range of 10 mTorr to 1000 mTorr.

40. The method according to claim 39, wherein said injecting comprises injecting a plasma containing a nitrogen gas into the processing chamber under a pressure of about 150 mTorr.

41. The method according to claim 38, wherein said injecting comprises injecting a plasma containing a nitrogen gas and a helium gas into the processing chamber.

42. A semiconductor device comprising:
- a semiconductor substrate;
- an oxide film formed in said substrate, the oxide film having an interface surface and an exposed surface; and
- a diffusion barrier formed on top of said exposed surface wherein the molecules forming said diffusion barrier do not penetrate said oxide film, and said diffusion barrier including nitrogen atoms and silane atoms.

43. The semiconductor device according to claim 42, wherein said semiconductor substrate comprises a silicon wafer.

44. The semiconductor device according to claim 42, wherein said oxide film has a thickness in a range of 10 to 50 Angstroms.

45. The semiconductor device according to claim 42, wherein said oxide film has a thickness of less than 20 Angstroms.

46. The semiconductor device according to claim 44, wherein said diffusion barrier has a thickness in a range of 5 to 30 Angstroms.

47. The semiconductor device according to claim 46, wherein said diffusion barrier has a thickness in a range of 15 to 20 Angstroms.

48. The semiconductor device according to claim 42, wherein said oxide layer forms a gate oxide film of a transistor.

49. The semiconductor device according to claim 42, wherein said diffusion barrier has a thickness in a range of 5 to 30 Angstroms.

50. The semiconductor device according to claim 49, wherein said diffusion barrier has a thickness in a range of 15 to 20 Angstroms.

51. The semiconductor device according to claim 42, wherein said oxide film comprises at least one chosen from zirconium oxide and hafnium oxide.

* * * * *